United States Patent
Tasai et al.

(10) Patent No.: US 11,984,533 B2
(45) Date of Patent: May 14, 2024

(54) LIGHT EMITTING DEVICE USING A GALLIUM NITRIDE (GaN) BASED MATERIAL

(71) Applicant: SONY CORPORATION, Tokyo (JP)

(72) Inventors: Kunihiko Tasai, Tokyo (JP); Hiroshi Nakajima, Tokyo (JP); Hidekazu Kawanishi, Tokyo (JP); Katsunori Yanashima, Tokyo (JP)

(73) Assignee: Sony Corporation, Tokyo (JP)

( * ) Notice: Subject to any disclaimer, the term of this patent is extended or adjusted under 35 U.S.C. 154(b) by 646 days.

(21) Appl. No.: 17/263,399

(22) PCT Filed: Jul. 1, 2019

(86) PCT No.: PCT/JP2019/026113
§ 371 (c)(1),
(2) Date: Jan. 26, 2021

(87) PCT Pub. No.: WO2020/021979
PCT Pub. Date: Jan. 30, 2020

(65) Prior Publication Data
US 2021/0159362 A1    May 27, 2021

(30) Foreign Application Priority Data

Jul. 27, 2018  (JP) .................................. 2018-140843

(51) Int. Cl.
*H01L 33/32* (2010.01)
*H01L 33/00* (2010.01)
(Continued)

(52) U.S. Cl.
CPC .......... *H01L 33/32* (2013.01); *H01L 33/0075* (2013.01); *H01L 33/12* (2013.01);
(Continued)

(58) Field of Classification Search
CPC ......... H01L 33/32; H01L 33/12; H01L 33/58; H01S 5/34333
See application file for complete search history.

(56) References Cited

U.S. PATENT DOCUMENTS

2011/0303931 A1\* 12/2011 Kang ...................... H01L 33/16
257/E33.028
2014/0042492 A1\* 2/2014 Tak ................... H01L 21/02381
257/190

FOREIGN PATENT DOCUMENTS

JP    2011-155241 A    8/2011
JP    2013-502731 A    1/2013
(Continued)

OTHER PUBLICATIONS

International Search Report issued in connection with PCT/JP2019/026113, dated Sep. 17, 2019.

*Primary Examiner* — Jay C Chang
*Assistant Examiner* — Mikka Liu
(74) *Attorney, Agent, or Firm* — K&L Gates LLP (57) ABSTRACT

A light emitting device according to an embodiment of the present disclosure includes: a first layer including $Al_{x2}In_{x1}Ga_{(1-x1-x2)}N$ ($0<x1<1$, $0\leq x2<1$); a second layer that is provided on the first layer and includes $Al_{y2}In_{y1}Ga_{(1-y1-y2)}N$ ($0<y1<1$, $0\leq y2<1$) that is lattice relaxed with respect to the first layer; and a third layer that is provided on the second layer, includes $Al_{z2}In_{z1}Ga_{(1-z1-z2)}N$ ($0<z1<1$, $0\leq z2<1$) that is lattice relaxed with respect to the second layer, and includes an active layer. A lattice constant aGAN of GaN in an in-plane direction, a lattice constant a1 of the first layer in an in-plane direction, a lattice constant a2 of the second layer in an in-plane direction, and a lattice constant a3 of the third layer in an in-plane direction have a relationship of aGAN<a2<a1, a3.

10 Claims, 6 Drawing Sheets

(51) Int. Cl.
*H01L 33/12* (2010.01)
*H01L 33/58* (2010.01)
*H01S 5/026* (2006.01)
*H01S 5/343* (2006.01)

(52) U.S. Cl.
CPC .............. *H01L 33/58* (2013.01); *H01S 5/026* (2013.01); *H01S 5/34333* (2013.01)

(56) References Cited

FOREIGN PATENT DOCUMENTS

JP  2013-247222 A  12/2013
JP  2014-038941 A  4/2017

\* cited by examiner

LIGHT EMITTING DEVICE USING A GALLIUM NITRIDE (GaN) BASED MATERIAL

TECHNICAL FIELD

The present disclosure relates to a light emitting device using, for example, a gallium nitride (GaN) based material.

BACKGROUND ART

A light emitting device using a gallium nitride (GaN) based material has been actively developed. As a light emitting device, for example, a semiconductor laser (Laser Diode; LD), a light emitting diode (Light Emitting Diode; LED), and the like are exemplified. In such a light emitting device, for example, a light emitting layer having a lattice constant, in a plane, larger than that of a substrate is provided (for example, refer to PTL 1).

CITATION LIST

Patent Literature

PTL 1: Japanese Unexamined Patent Application Publication No. 2013-115105

SUMMARY OF THE INVENTION

By the way, regarding a light emitting device using a GaN based material, an LD and an LED that emit light in a blue band and light in a green band have been in practical use. However, sufficient light emission is not obtained from the green band, and improvement in light emission efficiency is desired. Furthermore, although a GaInP based material is used for a red band, there is a problem that a GaInN based LED and LD have low light emission efficiency at high temperature.

It is desirable to provide a light emitting device that makes it possible to improve light emission efficiency.

A light emitting device according to an embodiment of the present disclosure includes: a first layer including $Al_{x2}In_{x1}Ga_{(1-x1-x2)}N$ ($0<x1<1$, $0 \le x2<1$); a second layer that is provided on the first layer and includes $Al_{y2}In_{y1}Ga_{(1-y1-y2)}N$ ($0<y1<1$, $0 \le y2<1$) that is lattice relaxed with respect to the first layer; and a third layer that is provided on the second layer, includes $Al_{z2}In_{z1}Ga_{(1-z1-z2)}N$ ($0<z1<1$, $0 \le z2<1$) that is lattice relaxed with respect to the second layer, and includes an active layer. A lattice constant aGAN of GaN in an in-plane direction, a lattice constant a1 of the first layer in an in-plane direction, a lattice constant a2 of the second layer in an in-plane direction, and a lattice constant a3 of the third layer in an in-plane direction have a relationship of aGAN<a2<a1, a3.

In the light emitting device according to the embodiment of the present disclosure, on the first layer having the lattice constant in the in-plane direction larger than that of GaN, the second layer that is lattice relaxed with respect to the first layer, and the third layer that is lattice relaxed with respect to the second layer and includes the active layer are stacked in this order. The GaN, the first layer, the second layer, and the third layer respectively have aGaN, a1, a2, and a3 as the lattice constants in the in-plane direction and have the relationship of aGAN<a2<a1, a3. As a result, an active layer, which is lattice relaxed with respect to GaN, is formed that has favorable single crystalline property and a small number of crystal defects.

According to the light emitting device of the embodiment of the present disclosure, the first layer having the lattice constant a1 in the in-plane direction, the second layer having the lattice constant a2, and the third layer that includes the active layer and has the lattice constant a3 are stacked in this order. The lattice constants a1, a2, and a3 are larger than the lattice constant aGAN of GaN and have a relationship of a2<a1, a3. Therefore, the active layer that has favorable single crystalline property and a small number of crystal defects is obtained, and it is possible to improve light emission efficiency of the active layer. That is, it is possible to provide a light emitting device having high light emission efficiency.

Note that the effects described above are not necessarily limiting and any effect described in the present disclosure may be provided.

MODES FOR CARRYING OUT THE INVENTION

Hereinafter, an embodiment of the present disclosure is described in detail with reference to the drawings. The following description is a specific example of the present disclosure, and the present disclosure is not limited to the following embodiments. Furthermore, arrangement, dimensions, a dimension ratio, and the like of each component of the present disclosure are not limited to those illustrated in the drawings. Note that an order of the description is as follows.

1. Embodiment (An example in which three layers having lattice constants in an in-plane direction larger than that of GaN are stacked in order of lattice constants that are large, small, and large)

1-1. Configuration of Light Emitting Device

1-2. Method of Manufacturing Light Emitting Device

1-3. Workings and Effects

2. First Modification Example (An example using a thick GaN Layer as a second layer)

3. Second Modification Example (An example using a superlattice as the second layer)
4. Third Modification Example (An example of a configuration as a semiconductor laser device)

1. Embodiment

Figure 1:
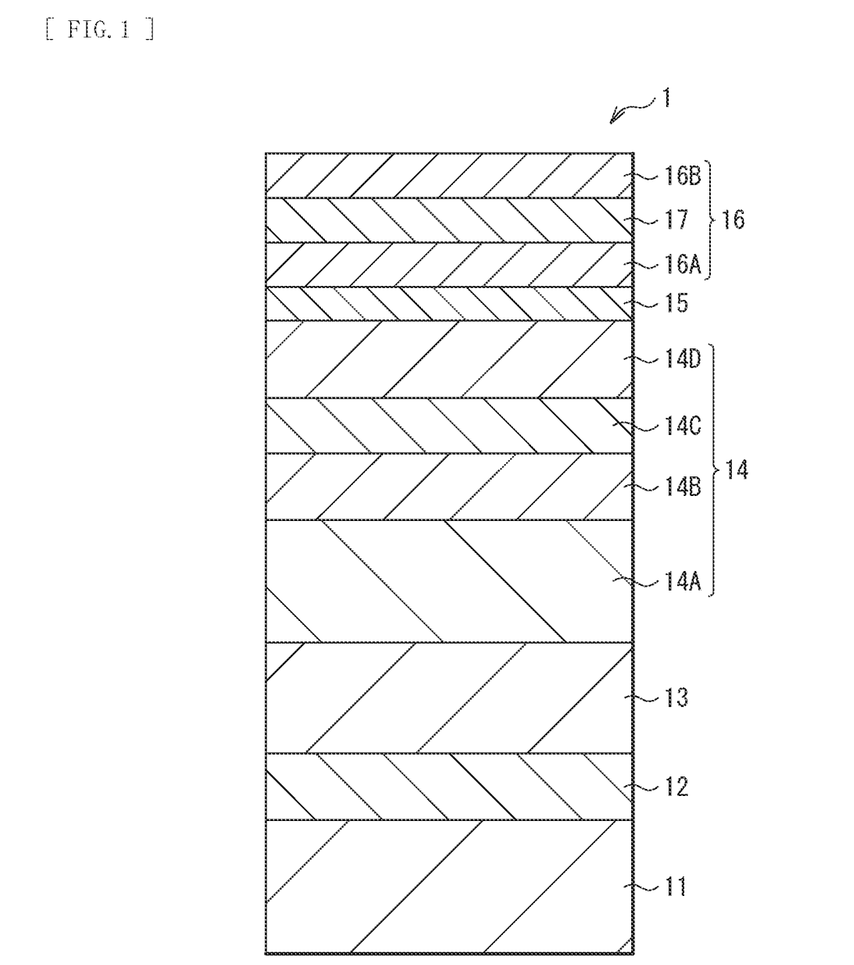
FIG. 1 is a cross-sectional schematic diagram illustrating a configuration of a light emitting device according to an embodiment of the present disclosure.

FIG. 1 schematically illustrates a cross-sectional configuration of a light emitting device (light emitting device 1) according to an embodiment of the present disclosure. The light emitting device 1 is, for example, a semiconductor laser, a light emitting diode, or the like that emits light having a wavelength in a visible region, particularly, a wavelength equal to or more than 500 nm. In the light emitting device 1 according to the present embodiment, a first layer 13 having a lattice constant a1 in an in-plane direction, a second layer 14 having a lattice constant a2 in an in-plane direction, and a third layer 16 having a lattice constant a3 in an in-plane direction are stacked on a substrate 11 in this order. The lattice constants a1, a2, and a3 in the in-plane direction are each larger than a lattice constant aGAN of GaN in an in-plane direction and have a relationship of aGAN<a2<a1, a3.

1-1. Configuration of Light Emitting Device

As described above, in the light emitting device 1, the first layer 13, the second layer 14, and the third layer 16 are stacked on the substrate 11 in this order, and the light emitting device 1 includes a light emitting layer (active layer 17) in the third layer 16. The light emitting device 1 according to the present embodiment is formed by using a gallium nitride (GaN) based material. Moreover, a buffer layer 12 is provided between the substrate 11 and the first layer 13, and a strained layer 15 is provided between the second layer 14 and the third layer 16. The first layer 13, the second layer 14, and the third layer 16 respectively have a1, a2, and a3 as the lattice constants in the in-plane direction as described above, and these lattice constants a1, a2, and a3 are larger than the lattice constant aGAN of GaN in the in-plane direction and have the relationship of aGAN<a2<a1, a3.

The substrate 11 is, for example, a gallium nitride (GaN) substrate, and a thickness of the substrate 11 is, for example, 300 μm to 500 μm. For example, a c-face of the GaN substrate is used as a principal surface. Note that, for the substrate 11, for example, a sapphire substrate, a silicon (Si) substrate, an aluminum nitride (AlN) substrate, and a zinc oxide (ZnO) substrate may be used other than the gallium nitride (GaN) substrate.

The buffer layer 12 is for lattice relaxation of the first layer 13 and is provided between the substrate 11 and the first layer 13. The buffer layer 12 is, for example, a low-temperature buffer layer and is a non-single crystalline layer formed, for example, at a low temperature of about 400° C. to 750° C. Examples of a non-single crystal include, for example, an amorphous, a polycrystal, and the like. The buffer layer 12 includes, for example, gallium nitride (GaN), gallium indium nitride (GaInN), aluminum gallium nitride (AlGaN), aluminum nitride (AlN), or aluminum nitride gallium indium (AlGaInN). A thickness of the buffer layer 12 is, for example, 10 nm to 100 nm.

The first layer 13 is provided in contact with the buffer layer 12. The first layer 13 includes $Al_{x2}In_{x1}Ga_{(1-x1-x2)}N$ ($0<x1<1$, $0≤x2<1$). A composition x1(%) of indium (In) in the first layer 13 is, for example, equal to or more than 0.5% and equal to or less than 30%. The first layer 13 provided on the buffer layer 12 has the lattice constant a1 in the in-plane direction larger than a lattice constant of the substrate 11 (GaN substrate) in the in-plane direction (for example, the c-face) and is lattice relaxed. The first layer 13 may be completely or partially relaxed with respect to the substrate 11. Note that the complete relaxation indicates a state with no strain with respect to a layer immediately below the layer, and the partial relaxation indicates a state where the layer has a strain with respect to a layer immediately below the layer. A thickness of the first layer 13 is, for example, 100 nm to 2000 nm. By setting the thickness of the first layer 13 to be equal to or more than 100 nm, more preferably, equal to or more than 500 nm, a crystal is configured that has superior single crystalline property and a lower dislocation density than those in a case of the thickness less than 100 nm.

Figure 2:
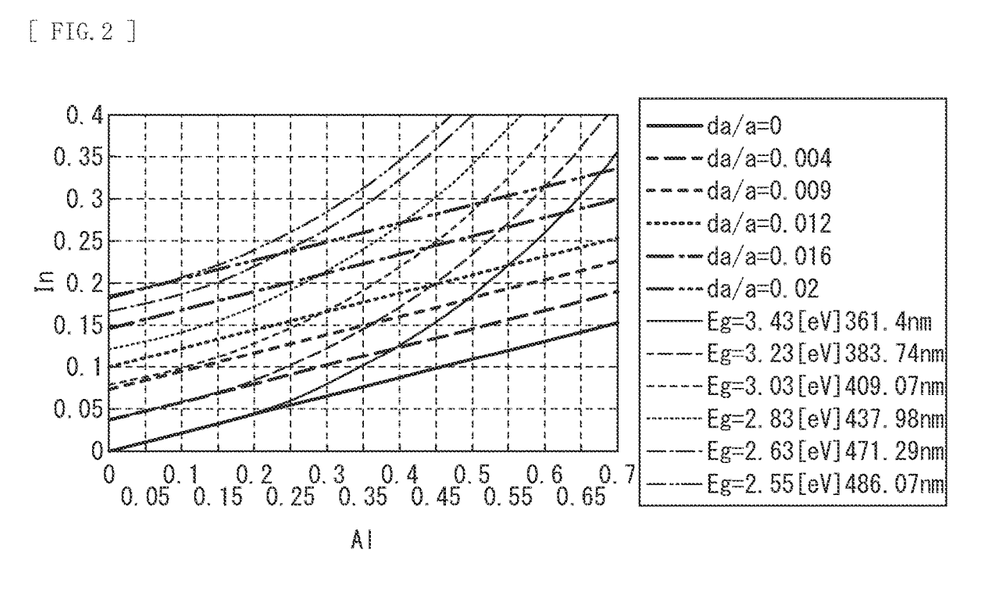
FIG. 2 is a diagram illustrating a relationship between a bandgap and a lattice constant with respect to compositions of Al and In in a layer including AlGaInN.

FIG. 2 illustrates contour lines of bandgaps (Eg [eV]) with respect to the compositions of Al and In and degrees of lattice unconformity (da/a) with respect to GaN, in the layer including AlGaInN. As a specific composition of the first layer 13, for example, GaInN is exemplified. However, AlGaInN including Al may be used. a indicates a lattice constant of GaN, da indicates a lattice constant difference between AlInGaN and GaN, and da/a indicates a degree of lattice unconformity between AlGaInN and GaN. For example, a lattice constant of AlGaInN on a contour line of da/a=0 is equal to that of GaN. That is, in a region upper than this contour line, it is possible to obtain a quaternary mixed crystal having a lattice constant larger than that of GaN. Furthermore, normally, in a case where GaInN is grown on the GaN substrate, its lattice constant a in the in-plane direction becomes the same and GaInN is epitaxially grown to be in a state where a crystal lattice of GaInN is strained in a growing direction. However, as described above, by providing the low-temperature buffer layer (buffer layer 12) on the side of the substrate 11 of GaInN, it is possible to obtain a GaInN layer having the lattice constant a in the in-plane direction larger than that of GaN, that is, a relaxed GaInN layer. Furthermore, in order to obtain the relaxed GaInN layer, a method is exemplified of growing GaInN to have a stacking thickness thicker than a critical thickness with respect to GaN, in addition to the method using the buffer layer.

The second layer 14 is provided in contact with the first layer 13. The second layer 14 includes $Al_{y2}In_{y1}Ga_{(1-y1-y2)}N$ ($0<y1<1$, $0≤y2<1$). The second layer 14 provided on the first layer 13 has the lattice constant a2 in the in-plane direction smaller than the lattice constant of the first layer 13 in the in-plane direction and is lattice relaxed. The second layer 14 may be completely or partially relaxed with respect to the first layer 13. The second layer 14 includes a plurality of layers. For example, as illustrated in FIG. 1, on the first layer 13, a layer including GaInN (GaInN layer) 14A, a layer including GaN (GaN layer) 14B, a layer having a stacked structure including n-GaInN and GaN (n-GaInN/GaN layer) 14C, and a layer including n-GaInN (n-GaInN layer) 14D are stacked in this order. A thickness of the second layer 14 is, for example, 100 nm to 2000 nm. By setting the thickness of the second layer 14 to be equal to or more than 100 nm, more preferably, equal to or more than 500 nm, a crystal is configured that has superior flatness and a lower dislocation density than those in a case of the thickness less than 100 nm. The strained layer 15 including, for example, GaN is provided on the second layer 14 and has a thickness of, for example, 1 nm to 50 nm.

The third layer 16 is provided in contact with the strained layer 15. The third layer 16 includes $Al_{z2}In_{z1}Ga_{(1-z1-z2)}N$ ($0<z1<1$, $0≤z2<1$). The third layer 16 provided on the second layer 14 has the lattice constant a3 in the in-plane direction larger than the lattice constant of the second layer 14 in the in-plane direction and is lattice relaxed. The third layer 16 may be completely or partially relaxed with respect to the second layer 14. The third layer 16 includes a plurality of layers. For example, as illustrated in FIG. 1, a layer including n-GaInN (n-GaInN layer) 16A and a layer including p-GaInN (p-GaInN layer) 16B are stacked in this order with the active layer 17 sandwiched therebetween. The active layer 17 includes, for example, GaInN. A thickness of the third layer 16 is, for example, 100 nm to 2000 nm.

In the light emitting device 1 according to the present embodiment, as described above, the lattice constants a1, a2, and a3 of the first layer 13, the second layer 14, and the third layer 16, which are stacked on the substrate 11 in order, in the in-plane direction satisfy the relationship of aGAN<a2<a1, a3. As a result, the second layer 14 and the third layer 16 have favorable flatness and favorable single crystalline property, and it is possible to form crystal layers each having a low dislocation density.

It is preferable that a magnitude of the lattice constant a1 of the first layer 13 in the in-plane direction satisfy (a1−aGaN)/aGaN>0.33%. A magnitude of the lattice constant a2 of the second layer 14 in the in-plane direction is a value between the lattice constant a1 of the first layer 13 in the in-plane direction and the lattice constant aGaN of the substrate 11, and it is preferable that the magnitude of the lattice constant a2 of the second layer 14 in the in-plane direction satisfy (a2−a1)/a1<−0.06%. The lattice constant a3 of the third layer 16 in the in-plane direction is a value larger than the lattice constant a2 of the second layer 14, and it is preferable that a magnitude of the lattice constant a3 of the third layer 16 in the in-plane direction satisfy (a3−a2)/a2>0.06%. Regarding a magnitude relationship, it does not matter which one of the lattice constant a1 of the first layer 13 and the lattice constant a3 of the third layer 16 is larger. However, by setting the lattice constant a1 and the lattice constant a3 to have values close to each other, the second layer 14 and the third layer 16 are configured that have superior flatness, higher single crystalline property, and include a crystal having a lower dislocation density.

By providing the light emitting device 1 according to the present embodiment with a three-stage structure in which the first layer 13, the second layer 14, and the third layer 16, which satisfy the above relationship, are stacked in order, it is possible to obtain the active layer 17 having favorable flatness and including a single crystal having a lattice constant in the in-plane direction larger than that of GaN in a state where the number of threading dislocations is small. Therefore, it is possible to largely improve light emission efficiency of the active layer 17.

Note that, in a case where the first layer 13, the second layer 14, and the third layer 16 have respective crystal structures having anisotropy in the in-plane direction, it is sufficient that lattice constants at least in one direction satisfy the above relationship. Furthermore, another layer may be further provided on the third layer 16, and for example, a layer that is lattice relaxed may be further provided.

Moreover, another layer may be provided between the first layer 13 and the second layer 14, as the strained layer 15 between the second layer 14 and the third layer 16. In the layers to be provided between the first layer 13 and the second layer 14 as well as between the second layer 14 and the third layer 16, for example, lattice constants may vary in a stepwise manner.

1-2. Method of Manufacturing Light Emitting Device

Figure 3A:
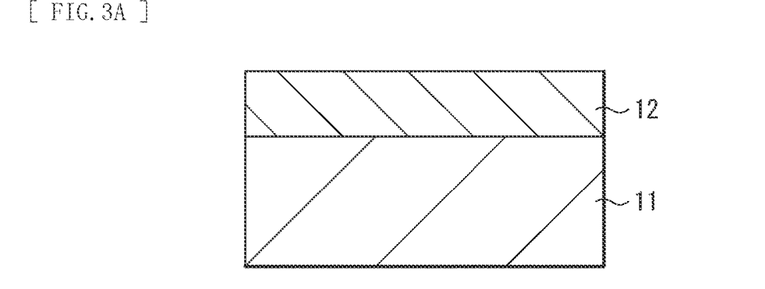
FIG. 3A is a cross-sectional schematic diagram for explaining a process of manufacturing the light emitting device illustrated in FIG. 1.
Figure 3B:
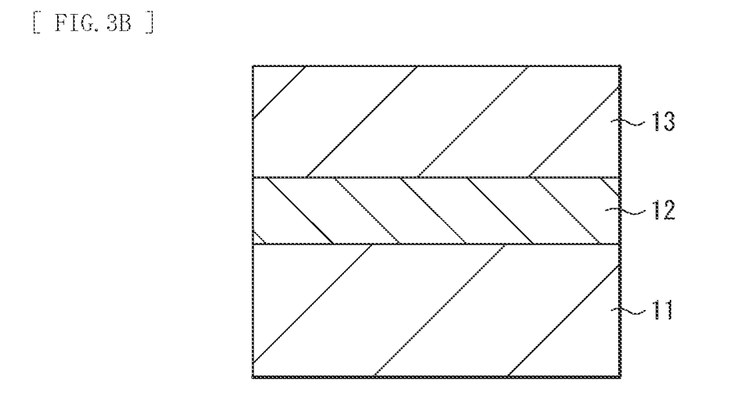
FIG. 3B is a cross-sectional schematic diagram illustrating a process subsequent to FIG. 3A.
Figure 3C:
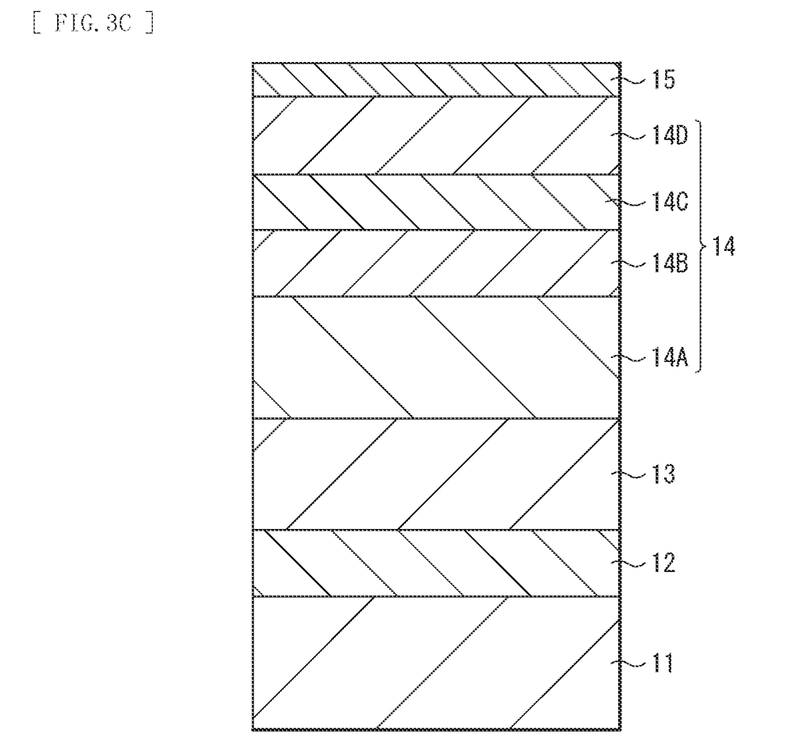
FIG. 3C is a cross-sectional schematic diagram illustrating a process subsequent to FIG. 3B.

It is possible to manufacture the light emitting device 1 according to the present embodiment, for example, as follows. FIGS. 3A to 3C illustrate a method of manufacturing the light emitting device 1 in a process order.

First, as illustrated in FIG. 3A, the buffer layer 12 is formed on the substrate 11. Specifically, the buffer layer 12 is formed by growing gallium indium nitride (GaInN) on the substrate 11 including GaN at the temperature of 400° C. to 750° C.

Next, as illustrated in FIG. 3B, the first layer 13 is formed on the buffer layer 12. The first layer 13 is formed, for example, by growing $Al_{x2}In_{x1}Ga_{(1-x1-x2)}$ N ($0<x1<1$, $0≤x2<1$) on the buffer layer 12 at the temperature of 700° C. to 900° C. In the first layer 13 on the buffer layer 12 that has been formed at low temperature, the lattice constant a1 in the in-plane direction is larger than that of gallium nitride (GaN). That is, the first layer 13 is formed to be lattice relaxed.

Subsequently, as illustrated in FIG. 3C, the second layer 14 is formed on the first layer 13. The second layer 14 is formed, for example, by growing $Al_{y2}In_{y1}Ga_{(1-y1-y2)}$ N ($0<y1<1$, $0≤y2<1$) on the first layer 13 at the temperature of 700° C. to 1000° C. Specifically, for example, after the GaInN layer 14A is formed, for example, with the thickness of 500 nm on the first layer 13, the GaN layer 14B is formed, for example, with the thickness of 500 nm. Subsequently, the n-GaInN/GaN layer 14C is formed, for example, with the thickness of 500 nm on the GaN layer 14B. Next, the n-GaInN layer 14D is formed, for example, with the thickness of 500 nm on the n-GaInN/GaN layer 14C. In each of the layers 14A, 14B, 14C, and 14D included in the second layer 14, the lattice constant a2 in the in-plane direction is smaller than the lattice constant a1 of the first layer 13 in the in-plane direction. That is, the second layer 14 is formed to be lattice relaxed. Next, after the second layer 14 is formed, the strained layer 15 is formed, for example, with the thickness of 5 nm on the second layer 14.

Finally, the third layer 16 is formed on the strained layer 15. The third layer 16 is formed, for example, by growing $Al_{z2}In_{z1}Ga_{(1-z1-z2)}$ N ($0<z1<1$, $0≤z2<1$) on the strained layer 15 at the temperature of 700° C. to 900° C. Specifically, for example, after the n-GaInN layer 16A is formed, for example, with the thickness of 200 nm on the strained layer 15, the active layer 17 is formed, for example, with the thickness of 3 nm. Subsequently, the p-GaInN 16B is formed, for example, with the thickness of 200 nm on the active layer 17. In each of the layers 16A, 16B, and 17 included in the third layer 16, the lattice constant a3 in the in-plane direction is larger than the lattice constant a2 of the second layer 14 in the in-plane direction. That is, the third layer 16 is formed to be lattice relaxed. Note that the n-GaInN layer 16A and the p-GaInN 16B may be undoped.

A method of varying the lattice constant of the second layer 14 in the in-plane direction to a2 and varying the lattice constant of the third layer 16 in the in-plane direction to a3 is described. In the above configuration example, the GaInN layer 14A and the n-GaInN layer 16A correspond to the layers in each which the lattice constant in the in-plane direction is to be varied. One example is forming each of the GaInN layer 14A and the n-GaInN layer 16A to have a thickness exceeding a critical thickness with respect to a layer immediately below. Alternatively, there is a method of applying a growing condition that promotes three-dimensional growth and introducing voids in a crystal. Furthermore, as described above, when the lattice constant in the plane is expanded from a2 to a3 in the n-GaInN layer 16A, as the strained layer 15, by once introducing a crystal having a lattice constant smaller than a2, and thereafter, stacking the n-GaInN layer 16A having a larger lattice constant, it is possible to easily perform lattice relaxation to a3. Moreover, as another method, there is a method of performing composition modulation on a superlattice structure such as GaInN/GaN, AlGaN/GaN, AlGaN/GaInN, or the like in a growth direction and promoting lattice relaxation, etc. Here, the lattice constant of the strained layer 15 in the in-plane direction may have a lattice constant between aGaN and a3 because of the thickness. As described above, the light emitting device 1 illustrated in FIG. 1 is completed.

1-3. Workings and Effects

The light emitting device using a gallium nitride (GaN) based material has been developed as a device that emits light in a visible region, and one of applications of the device is a display using a device that emits RGB light. In the visible region, practical use of a blue band and a green band has been already achieved by an LED or an LD using the GaN based material. However, improvement in light emission efficiency of the LED and LD that emit light in the green band is desired. Although the light emitting device that emits light in a red band uses a GaInP based material, there is a problem that an LED and an LD using the GaInP based material have low light emission efficiency at high temperature.

In general, for the device that emits light in the visible region using the GaN based material, GaInN is used for an active layer. As a composition of In increases, a light emitting wavelength of GaInN becomes longer. Although it depends on the thickness of the active layer, for example, 16% results in the blue band, 23% results in the green band, and 33% results in the red band. On the other hand, as the composition of In increases, a light emission recombination possibility is decreased, and a non-light emission recombination possibility is increased. It is accordingly difficult to provide an LED or an LD having favorable light emission characteristics in a wavelength region longer than the blue band. Causes of the decrease in the light emission recombination possibility include an increase in a fluctuation of the In composition and an increase in piezoelectric polarization. Regarding the increase in the non-light emission recombination possibility, occurrence of a crystal defect caused by an increase in the degree of lattice unconformity of any of the GaN substrate and a GaN template substrate with a GaInN active layer can be mentioned. Furthermore, because the piezoelectric polarization described above increases in proportion to the degree of lattice unconformity of any of the GaN substrate and the GaN template substrate with the GaInN active layer, reduction in a strain amount of the GaInN active layer is an important factor to improve the light emission efficiency.

As one of methods of reducing the strain amount of the GaInN active layer, to use a GaInN substrate is considered. However, it is difficult to obtain a GaInN bulk substrate having favorable crystallizability. In addition, it is considered to use a substrate including different kinds of materials such as $ScAlMgO_4$, ZnO, or $MgAl_2O_4$ of which a lattice constant matches that of GaInN. However, it is not easy to obtain a crystal having high quality on the substrate including different kinds of materials. Furthermore, a method is considered of stacking lattice-relaxed GaInN on the GaN substrate or the GaN template substrate and further growing an active layer thereon. Specifically, for example, a structure using a superlattice of GaInN/GaN on the GaN template substrate and a structure in which a GaInN layer is stacked on a low-temperature GaInN buffer layer are exemplified. However, a unimodality of an X-ray diffraction peak of lattice-relaxed GaInN obtained by using the above method is low, and the number of crystal defects is large. It is difficult to grow an active layer having favorable crystallizability on GaInN having low crystallizability.

In contrast, in the light emitting device 1 according to the present embodiment, the first layer 13 including $Al_{x2}In_{x1}Ga_{(1-x1-x2)}$ N ($0<x1<1$, $0 \leq x2<1$), the second layer 14 including $Al_{y2}In_{y1}Ga_{(1-y1-y2)}$ N ($0<y1<1$, $0 \leq y2<1$) lattice relaxed with respect to the first layer 13, and the third layer 16 that includes $Al_{z2}In_{z1}Ga_{(1-z1-z2)}$ N ($0<z1<1$, $0 \leq z2<1$) lattice relaxed with respect to the second layer 14 and includes the active layer 17 are stacked in this order on the substrate 11 including GaN. The lattice constant a1 of the first layer 13 in the in-plane direction, the lattice constant a2 of the second layer 14 in the in-plane direction, and the lattice constant a3 of the third layer 16 in the in-plane direction are larger than the lattice constant aGaN of GaN in the in-plane direction and have the relationship of aGAN<a2<a1, a3. As a result, it is possible to form the active layer 17 that is lattice relaxed with respect to GaN and has favorable single crystalline property, a small threading dislocation, and favorable flatness.

The above mechanism is described. If only the first layer 13 having the lattice constant a1 in the in-plane direction is provided between the substrate 11 and the active layer, an active layer that has a large number of threading dislocations and of which the flatness of the surface is deteriorated is formed on the first layer 13. In contrast, as in the present embodiment, by forming, on the first layer 13, the second layer 14 having the lattice constant a2 in the in-plane direction smaller than the lattice constant a1 of the first layer 13 in the in-plane direction, it is possible to grow a thicker GaN layer that easily grows in a horizontal direction. As a result, it is possible to form the active layer 17 that has fewer threading dislocations and favorable flatness.

Furthermore, if a layer having a two-stage configuration including the second layer 14 having the lattice constant a2 in the in-plane direction and the third layer 16 having the lattice constant a3 in the in-plane direction is provided between the substrate 11 and the active layer, the flatness of the third layer 16 is significantly deteriorated, and a breakthrough potential density of the third layer 16 is increased. In contrast, as in the present embodiment, in a case where a structure is provided in which the lattice constant in the in-plane direction between the substrate 11 and the active layer varies in three steps, the deterioration in the flatness and the increase in the breakthrough potential density do not occur when the lattice constant in the in-plane direction varies from a2 to a3 (a2<a3). This is because the first layer 13 having the large lattice constant a1 in the in-plane direction is provided below the second layer 14. When the lattice constant in the in-plane direction is expanded from a2 to a3 (a2<a3), as described above, it is possible to expand the lattice constant from a2 to a3 (a2<a3) by smaller voids in a case where the voids are introduced in the n-GaInN layer 16A layer, for example, in the crystal, and the deterioration in the flatness is improved.

As described above, in the light emitting device 1 according to the present embodiment, the first layer 13 having the lattice constant a1 in the in-plane direction, the second layer 14 having the lattice constant a2 in the in-plane direction, and the third layer 16 having the lattice constant a3 in the in-plane direction are stacked in this order. The lattice constants a1, a2, and a3 are larger than the lattice constant aGaN of GaN in the in-plane direction and have the relationship of aGAN<a2<a1, a3. As a result, the active layer 17 is obtained that has a low threading dislocation density and has improved flatness. That is, it is possible to provide a light emitting device having high light emission efficiency.

In particular, because the strain amount of the active layer is reduced in the active layer 17 including GaInN that emits light in the green band and the red band, the piezoelectric polarization that occurs in the active layer 17 is reduced, and the light emission recombination possibility is increased. Furthermore, by reducing defects generated in the active layer 17, the non-light emission recombination possibility is reduced. Therefore, it is possible to largely improve the light emission efficiency of the active layer 17 including GaInN.

Next, modification examples of the present disclosure (first to third modification examples) are described. Hereinafter, a component similar to that in the embodiment described above is denoted with the same reference numeral, and a description thereof is appropriately omitted.

2. First Modification Example

Figure 4:
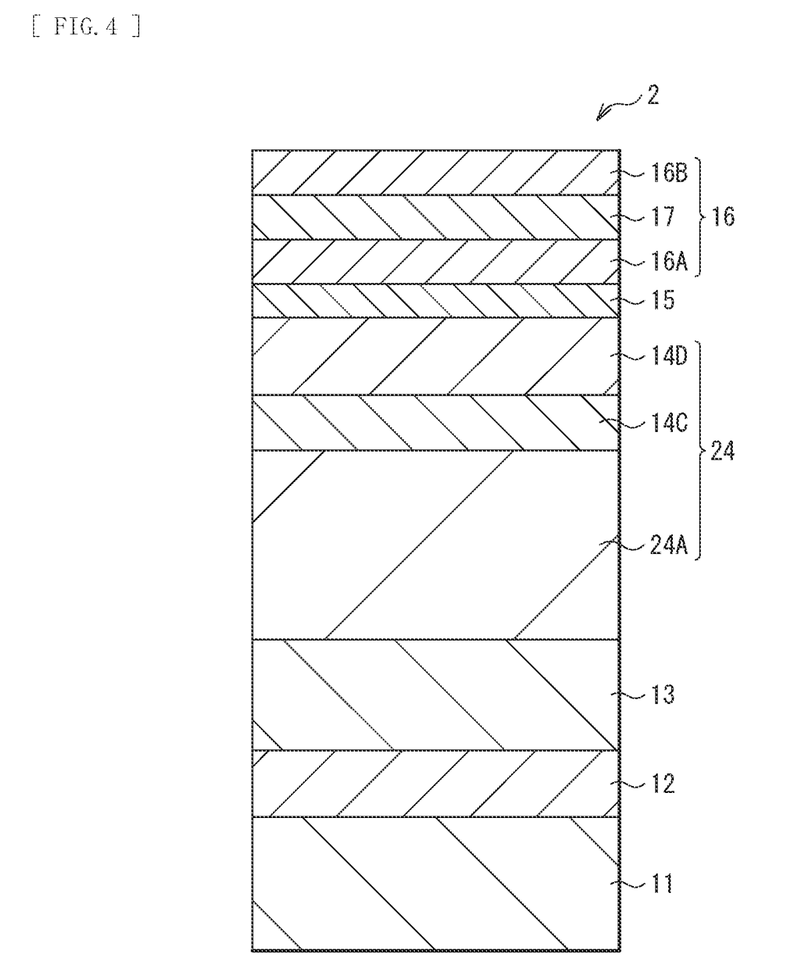
FIG. 4 is a cross-sectional schematic diagram illustrating a configuration of a light emitting device according to a first modification example of the present disclosure.

FIG. 4 schematically illustrates a cross-sectional configuration of a light emitting device (light emitting device 2) according to a modification example (first modification example) of the present disclosure. This light emitting device 2 is a semiconductor laser, a light emitting diode, or the like that emits light, for example, in a visible region, in particular, having a wavelength of equal to or more than 500 nm. As in the embodiment described above, in the light emitting device 2, a first layer 13 having a lattice constant a1, a second layer 24 having a lattice constant a2, and a third layer 16 having a lattice constant a3 are stacked in this order. The lattice constants a1, a2, and a3 are larger than a lattice constant aGAN of GaN in an in-plane direction and have a relationship of aGAN<a2<a1, a3. The present modification example is different from the embodiment described above in that the second layer 24 includes three layers, for example, a GaN layer 24A having a thickness equal to or more than 5 nm, an n-GaInN/GaN layer 14C, and an n-GaInN layer 14D.

The second layer 24 having the lattice constant a2 that satisfies the relationship of aGAN<a2<a1, a3 is obtained also by forming a layer on the most first layer 13 side with the GaN layer 24A having the thickness that exceeds a critical thickness, in addition to, configuring the layer provided on the most first layer 13 side with GaInN. Note that the n-GaInN/GaN layer 14C and the n-GaInN layer 14D included in the second layer 24 have configurations similar to those of the embodiment described above.

In this way, by providing the GaN layer 24A, for example, having the thickness that exceeds the critical thickness and is equal to or more than 5 nm, instead of the GaInN layer 14A, as the layer, provided on the most first layer 13 side, of the second layer 24, it is possible to form the light emitting device 2 that is lattice relaxed with respect to the first layer 13, is larger than the lattice constant aGAN of the GaN in the in-plane direction, and has the relationship of aGAN<a2<a1, a3. That is, it is possible to provide the light emitting device 2 having characteristics equivalent to that of the embodiment described above.

3. Second Modification Example

Figure 5:
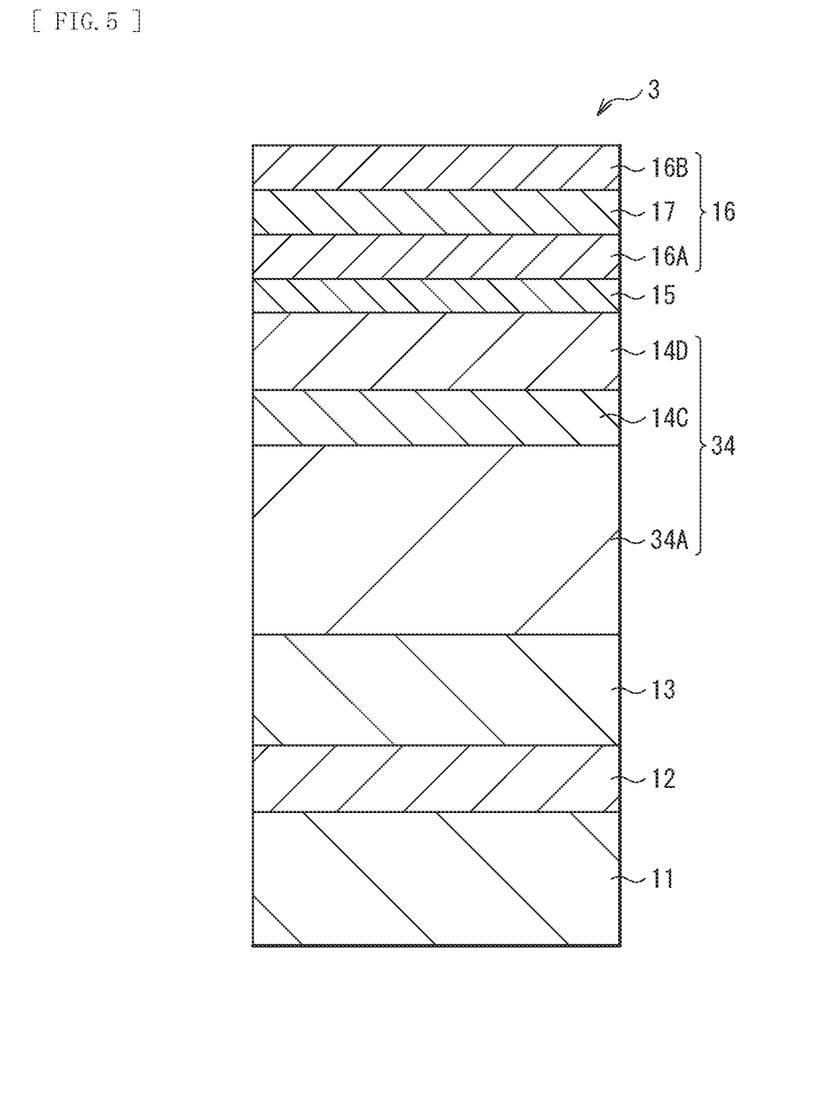
FIG. 5 is a cross-sectional schematic diagram illustrating a configuration of a light emitting device according to a second modification example of the present disclosure.

FIG. 5 schematically illustrates a cross-sectional configuration of a light emitting device (light emitting device 3) according to a modification example (second modification example) of the present disclosure. This light emitting device 3 is a semiconductor laser, a light emitting diode, or the like that emits light, for example, in a visible region, in particular, having a wavelength of equal to or more than 500 nm. As in the embodiment described above, in the light emitting device 3, a first layer 13 having a lattice constant a1, a second layer 34 having a lattice constant a2, and a third layer 16 having a lattice constant a3 are stacked in this order. The lattice constants a1, a2, and a3 are larger than a lattice constant aGAN of GaN in an in-plane direction and have a relationship of aGAN<a2<a1, a3. The present modification example is different from the embodiment described above in that the second layer 34 includes three layers including an AlGaN/GaN layer 34A, an n-GaInN/GaN layer 14C, and an n-GaInN layer 14D. The AlGaN/GaN layer 34A includes AlGaN and GaN that are stacked and has a superlattice structure.

The second layer 34 having the lattice constant a2 that satisfies the relationship of aGAN<a2<a1, a3 is obtained also by forming a layer provided on the most first layer 13 side with a layer (AlGaN/GaN layer) 34A having a superlattice structure in which AlGaN and GaN are stacked, in addition to configuring the layer provided on the most first layer 13 side with GaIaN or thickly-formed GaN. Also when the AlGaN/GaN layer 34A has a structure in which AlGaN and GaInN or AlGaN and GaN are stacked, other than an AlGaN/GaN stacked structure, a similar effect is obtained. Note that the n-GaInN/GaN layer 14C and the n-GaInN layer 14D included in the second layer 34 have configurations similar to those of the embodiment described above.

In this way, by providing the layer (AlGaN/GaN layer) 34A having the superlattice structure of AlGaN/GaN or the like, instead of the GaInN layer 14A, as the layer, provided on the most first layer 13 side, of the second layer 34, it is possible to form the light emitting device 2 that is lattice relaxed with respect to the first layer 13, is larger than the lattice constant aGAN of GaN in the in-plane direction, and has the relationship of aGAN<a2<a1, a3. That is, it is possible to provide the light emitting device 3 that has characteristics equivalent to that of the embodiment described above.

4. Third Modification Example

Figure 6:
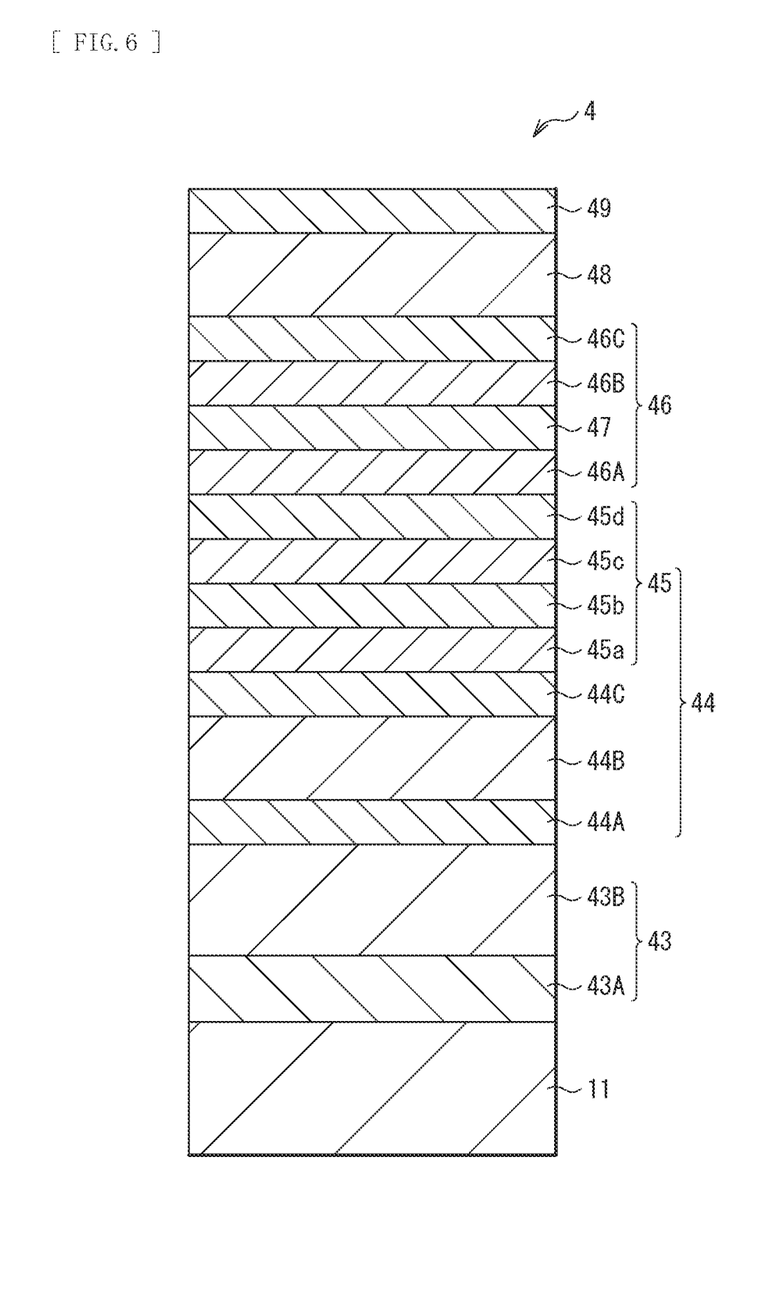
FIG. 6 is a cross-sectional schematic diagram illustrating a configuration of a light emitting device according to a third modification example of the present disclosure.

FIG. 6 schematically illustrates a cross-sectional configuration of a light emitting device (light emitting device 4) according to a modification example (third modification example) of the present disclosure. This light emitting device 4 is a semiconductor laser that emits light, for example, in a visible region, in particular, having a wavelength equal to or more than 500 nm. In the light emitting device 4 according to the present modification example, as in the embodiment described above, a first layer 43 having a lattice constant a1, a second layer 44 having a lattice constant a2, and a third layer 46 having a lattice constant a3 are stacked in this order. The lattice constants a1, a2, and a3 are larger than a lattice constant aGAN of GaN in an in-plane direction and have a relationship of aGAN<a2<a1, a3. A cladding layer 45 is formed in the second layer 44, and an active layer 47 and a light guide layer are formed in the third layer 46. Moreover, a cladding layer 48 and a contact layer 49 are stacked on the third layer 46.

In the light emitting device 4 according to the present modification example, the first layer 43, the second layer 44 including the cladding layer 45, the third layer 46 configuring the light guide layer including the active layer 47, the cladding layer 48, and the contact layer 49 are stacked in this order.

A substrate 11 is, for example, a gallium nitride (GaN) substrate, and a thickness of the substrate 11 is, for example, 300 μm to 500 μm. For example, a c-face of the gallium nitride (GaN) substrate is used as a principal surface.

The first layer 43 is provided in contact with the substrate 11. Similarly to the first layer 13 according to the embodiment described above, the first layer 43 has the lattice constant a1 in the in-plane direction larger than a lattice constant of the substrate 11 (gallium nitride (GaN) substrate) in the in-plane direction (for example, the c-face) and is lattice relaxed. In the first layer 43, for example, a buffer layer (GaInN buffer layer) 43A including GaInN and a layer (for example, $Ga_{0.95}In_{0.05}N$ layer) 43B including $Al_{x2}In_{x1}Ga_{(1-x1-x2)}N$ ($0<x1<1$, $0 \leq x2<1$) are stacked in this order. A thickness of the GaInN buffer layer 43A is, for example, 10 nm to 100 nm, and a thickness of the $Ga_{0.95}In_{0.05}N$ layer 43B is, for example for example, 100 nm to 2000 nm.

The second layer 44 is provided in contact with the first layer 43. The second layer 44 includes $Al_{y2}In_{y1}Ga_{(1-y1-y2)}N$ ($0<y1<1$, $0 \leq y2<1$). Similarly to the second layer 14 according to the embodiment described above, the second layer 44 provided on the first layer 43 has the lattice constant a2 in the in-plane direction smaller than the lattice constant of the first layer 43 in the in-plane direction and is lattice relaxed. The second layer 44 may be completely or partially relaxed with respect to the first layer 43.

The second layer 44 includes a plurality of layers. For example, as illustrated in FIG. 6, a layer (GaN layer) 44A including GaN, a layer (GaN/$Ga_{0.95}In_{0.05}N$ layer) 44B including GaN/$Ga_{0.95}In_{0.05}N$, and a layer (GaN layer) 44C including GaN are stacked on the first layer 43 in this order. Further, on the GaN layer 44C, a GaN/$Ga_{0.97}In_{0.03}N$ layer 45a, a GaN/$Ga_{0.96}In_{0.04}N$ layer 45b, a GaN/$Ga_{0.95}In_{0.05}N$ layer 45c, and a GaN/$Ga_{0.94}In_{0.06}N$ layer 45d, each which include GaN/GaInN, are stacked in this order as the cladding layer 45. A thickness of the second layer 44 is, for example, 30 nm to 750 nm. For example, a thickness of the GaN layer 44A is, for example, 30 nm to 750 nm. A thickness of the GaN/$Ga_{0.95}In_{0.05}N$ layer 44B is, for example, 100 nm to 1000 nm. A thickness of the GaN layer 44C is, for example, 30 nm to 200 nm. A thickness of the GaN/$Ga_{0.97}In_{0.03}N$ layer 45a is, for example, 30 nm to 500 nm. A thickness of the GaN/$Ga_{0.96}In_{0.04}N$ layer 45b is, for example, 30 nm to 500 nm. A thickness of the GaN/$Ga_{0.95}In_{0.05}N$ layer 45c is, for example, 30 nm to 500 nm. A thickness of the GaN/$Ga_{0.94}In_{0.06}N$ layer 45d is, for example, 30 nm to 500 nm.

The third layer 46 is provided in contact with the cladding layer 45 configuring the second layer 44. The third layer 46 includes $Al_{z2}In_{z1}Ga_{(1-z1-z2)}N$ ($0<z1<1$, $0 \leq z2<1$). The third layer 46 provided on the second layer 44 has the lattice constant a3 in the in-plane direction larger than the lattice constant of the second layer 44 in the in-plane direction and is lattice relaxed. The third layer 46 may be completely or partially relaxed with respect to the second layer 44 (specifically, the cladding layer 45). The third layer 46 includes a plurality of layers. For example, as illustrated in FIG. 6, for example, a layer including GaN/$Ga_{0.92}In_{0.08}N$ (GaN/$Ga_{0.92}In_{0.08}N$ layer 46A), the active layer 47 including a single quantum well or a multiple quantum well, the GaN layer 46B, and a GaN/$Ga_{0.94}In_{0.06}N$ layer 46C are stacked in this order and form a so-called light guide layer. The GaN/$Ga_{0.92}In_{0.08}N$ layer 46A may be n-type doped or undoped, and the GaN/$Ga_{0.94}In_{0.06}N$ layer 46C may be similarly p-type doped or undoped.

The cladding layer 48 is provided, for example, in contact with the GaN/$Ga_{0.94}In_{0.06}N$ layer 46C configuring the third layer 46. The cladding layer 48 includes, for example, a GaN/$Ga_{0.95}In_{0.05}N$ layer. A thickness of the cladding layer 48 is, for example, 50 nm to 500 nm. The contact layer 49 is provided, for example, in contact with the cladding layer 48. The contact layer 49 includes, for example, GaN. A thickness of the contact layer 49 is, for example, 10 nm. The cladding layer 48 and the contact layer 49 are each p-type doped, and, for example, magnesium (Mg) is used as a dopant.

Note that, although unillustrated, a strained layer, for example, including GaN with a thickness of, for example, 3 nm to 10 nm is formed between the second layer 44 and the third layer 46.

In this way, by inserting GaN, which has a lattice constant in the in-plane direction smaller than a2, between the second layer 44 and the third layer 46 and growing the GaInN layer (GaN/$Ga_{0.92}In_{0.08}N$ layer) 46A having a higher In composition than the second layer 44 on the second layer 44, it is possible to expand the lattice constant a3 of the third layer 46. Therefore, the active layer 47 is formed that has a strain smaller than that of an active layer that has been coherently grown on a GaN substrate by a usual method, and it is possible to largely improve light emission efficiency of the active layer 47.

In order to favorably confine light by the semiconductor laser, it is necessary for each of the cladding layer and the light guide layer to have a film thickness equal to or more than several-hundred nanometers. In a general light emitting device, a lattice constant of an entire device in the in-plane direction is the same, and all layers are coherently grown with respect to a substrate. However, for example, in a case where all the device layers have a lattice constant a equivalent to that of the light guide layer, although it is possible to grow the film thickness of the light guide layer, a designed thickness of a stacked layer thickness of the cladding layer is limited from a viewpoint of the critical thickness. Conversely, in a case where all the device layers have a lattice constant equivalent to that of the cladding layer, a stacked layer thickness of the light guide layer is limited from a viewpoint of the critical thickness. In contrast, according to the present embodiment, it is possible to select a desired lattice constant (a2 and a3) for each of the cladding layer and the light guide layer, a degree of freedom of design with respect to light confinement is increased, and it is possible to design a laser structure that favorably confines light and has a small internal loss. It is therefore possible to largely improve a threshold current and a slope efficiency of the semiconductor laser.

Whereas, in the present modification example, it is possible to apply a lattice constant that matches GaInN of a desired In composition to each of the cladding layer 45 and the third layer 46 configuring the light guide layer. Therefore, it is possible to improve a degree of freedom of structure design. Furthermore, because light confinement and a loss are reduced, it is possible to provide a semiconductor laser having high device characteristics.

The present disclosure has been described above by referring to the embodiment and the first to the third modification examples. However, the present disclosure is not limited to the embodiment described above, and is modifiable in a variety of ways. For example, the component, the arrangement, the number, or the like of the light emitting device 1 exemplified in the embodiment described above are merely examples. It is not necessary to include all the components, and another component may be further included.

Moreover, in the embodiment or the like described above, the light emitting device 1 including the light emitting layer (active layer 17) on the substrate 11 has been described as an example. However, it is possible to apply the present disclosure to an electronic device including a layer that has a function other than light emission.

Note that the effects described herein are merely examples and are non-limiting. Further, another effect may be provided.

Note that it is possible for the present disclosure to have the following configurations.

(1)
A light emitting device including:
a first layer including $Al_{x2}In_{x1}Ga_{(1-x1-x2)}N$ ($0<x1<1$, $0 \leq x2<1$);
a second layer that is provided on the first layer and includes $Al_{y2}In_{y1}Ga_{(1-y1-y2)}N$ ($0<y1<1$, $0 \leq y2<1$) that is lattice relaxed with respect to the first layer; and
a third layer that is provided on the second layer, includes $Al_{z2}In_{z1}Ga_{(1-z1-z2)}N$ ($0<z1<1$, $0 \leq z2<1$) that is lattice relaxed with respect to the second layer, and includes an active layer, in which
a lattice constant aGAN of GaN in an in-plane direction, a lattice constant a1 of the first layer in an in-plane direction, a lattice constant a2 of the second layer in an in-plane direction, and a lattice constant a3 of the third layer in an in-plane direction have a relationship of aGAN $<$a2$<$a1, a3.

(2)
The light emitting device according to (1) described above, in which the lattice constant a1 of the first layer in the in-plane direction and the lattice constant a2 of the second layer in the in-plane direction satisfy a relationship of (a2−a1)/a1$<$−0.06%, the lattice constant a2 of the second layer in the in-plane direction and the lattice constant a3 of the third layer in the in-plane direction satisfy a relationship of (a3−a2)/a2$>$0.06%, and the lattice constant a1 of the first layer in the in-plane direction and the lattice constant aGAN of GaN in the in-plane direction satisfy a relationship of (a1−aGAN)/aGAN$>$0.33%.

(3)
The light emitting device according to (1) or (2) described above, in which the third layer includes a plurality of layers including the active layer, and the active layer and the plurality of layers all have the lattice constant a3 in the in-plane direction.

(4)
The light emitting device according to any one of (1) to (3) described above, in which the second layer includes a plurality of layers each having the lattice constant a2 in the in-plane direction, and a total thickness of the plurality of layers having the lattice constant a2 is equal to or more than 100 nm.

(5)
The light emitting device according to any one of (1) to (4) described above, in which the third layer includes a plurality of layers each having the lattice constant a3 in the in-plane direction, and a total thickness of the plurality of layers having the lattice constant a3 is equal to or more than 100 nm.

(6)
The light emitting device according to any one of (1) to (5) described above, in which the second layer includes a cladding layer, and the third layer includes a light guide layer.

(7)
The light emitting device according to any one of (1) to (6) described above, further including
a substrate, in which
the first layer, the second layer, and the third layer are provided on the substrate in this order.

(8)
The light emitting device according to (7) described above, further including
a buffer layer between the substrate and the first layer, in which
the buffer layer includes gallium nitride (GaN), gallium indium nitride (GaInN), aluminum gallium nitride (AlGaN), aluminum nitride (AlN), or aluminum gallium indium nitride (AlGaInN).

(9)
The light emitting device according to (7) or (8) described above, in which the substrate includes a gallium nitride (GaN) substrate.

(10)
The light emitting device according to (7) or (8) described above, in which the substrate includes a sapphire substrate, a silicon (Si) substrate, an aluminum nitride (AlN) substrate, or a zinc oxide (ZnO) substrate.

The present application claims priority based on Japanese Patent Application No. 2018-140843 filed with the Japan Patent Office on Jul. 27, 2018, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. A light emitting device comprising:
a first layer including $Al_{x2}In_{x1}Ga_{(1-x1-x2)}N$ ($0<x1<1$, $0 \leq x2<1$);
a second layer that is provided on the first layer and includes $Al_{y2}In_{y1}Ga_{(1-y1-y2)}N$ ($0<y1<1$, $0 \leq y2<1$); that is lattice relaxed with respect to the first layer; and
a third layer that is provided on the second layer, includes $Al_{z2}In_{z1}Ga_{(1-z1-z2)}N$ ($0<z1<1$, $0 \leq z2<1$) that is lattice relaxed with respect to the second layer, and includes an active layer, wherein
a lattice constant aGAN of GaN in an in-plane direction, a lattice constant a1 of the first layer in an in-plane direction, a lattice constant a2 of the second layer in an in-plane direction, and a lattice constant a3 of the third layer in an in-plane direction have a relationship of aGAN $<$a2$<$a1, a3.

2. The light emitting device according to claim 1, wherein the lattice constant a1 of the first layer in the in-plane direction and the lattice constant a2 of the second layer in the in-plane direction satisfy a relationship of (a2−a1)/a1$<$−0.06%, the lattice constant a2 of the second layer in the in-plane direction and the lattice constant a3 of the third layer in the in-plane direction satisfy a relationship of (a3−a2)/a2 $>$0.06%, and the lattice constant a1 of the first layer in the in-plane direction and the lattice constant aGAN of GaN in the in-plane direction satisfy a relationship of (a1−aGAN)/aGAN $>$0.33%.

3. The light emitting device according to claim 1, wherein the third layer includes a plurality of layers including the active layer, and the active layer and the plurality of layers all have the lattice constant a3 in the in-plane direction.

4. The light emitting device according to claim 1, wherein the second layer includes a plurality of layers each having the lattice constant a2 in the in-plane direction, and a total thickness of the plurality of layers having the lattice constant a2 is equal to or more than 100 nm.

5. The light emitting device according to claim 1, wherein the third layer includes a plurality of layers each having the lattice constant a3 in the in-plane direction, and a total thickness of the plurality of layers having the lattice constant a3 is equal to or more than 100 nm.

6. The light emitting device according to claim 1, wherein the second layer includes a cladding layer, and the third layer includes a light guide layer.

7. The light emitting device according to claim 1, further comprising
a substrate, wherein
the first layer, the second layer, and the third layer are provided on the substrate in this order.

8. The light emitting device according to claim 7, further comprising
a buffer layer between the substrate and the first layer, wherein
the buffer layer includes gallium nitride (GaN), gallium indium nitride (GaInN), aluminum gallium nitride (AlGaN), aluminum nitride (AlN), or aluminum gallium indium nitride (AlGaInN).

9. The light emitting device according to claim 7, wherein the substrate includes a gallium nitride (GaN) substrate.

10. The light emitting device according to claim 7, wherein the substrate includes a sapphire substrate, a silicon (Si) substrate, an aluminum nitride (AlN) substrate, or a zinc oxide (ZnO) substrate.

* * * * *